(12) United States Patent
Zang et al.

(10) Patent No.: US 9,831,317 B1
(45) Date of Patent: Nov. 28, 2017

(54) BURIED CONTACT STRUCTURES FOR A VERTICAL FIELD-EFFECT TRANSISTOR

(71) Applicant: GLOBALFOUNDRIES Inc., Grand Cayman (KY)

(72) Inventors: Hui Zang, Guilderland, NY (US); Tek Po Rinus Lee, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/447,639

(22) Filed: Mar. 2, 2017

(51) Int. Cl.
| | |
|---|---|
| *H01L 29/78* | (2006.01) |
| *H01L 29/417* | (2006.01) |
| *H01L 29/66* | (2006.01) |
| *H01L 29/10* | (2006.01) |
| *H01L 21/285* | (2006.01) |
| *H01L 21/311* | (2006.01) |

(52) U.S. Cl.
CPC .. *H01L 29/41741* (2013.01); *H01L 21/28556* (2013.01); *H01L 21/31116* (2013.01); *H01L 29/1037* (2013.01); *H01L 29/66666* (2013.01); *H01L 29/7827* (2013.01)

(58) Field of Classification Search
CPC ........... H01L 29/7827; H01L 29/41741; H01L 29/41766; H01L 29/41775; H01L 27/092
See application file for complete search history.

(56) References Cited

U.S. PATENT DOCUMENTS

| | | | | |
|---|---|---|---|---|
| 5,627,393 | A * | 5/1997 | Hsu | H01L 29/66666 |
| | | | | 257/331 |
| 6,891,225 | B2 * | 5/2005 | Horiguchi | H01L 27/108 |
| | | | | 257/331 |
| 7,230,286 | B2 * | 6/2007 | Cohen | B82Y 10/00 |
| | | | | 257/210 |
| 2012/0238061 | A1 * | 9/2012 | Fischer | H01L 21/823425 |
| | | | | 438/157 |

* cited by examiner

*Primary Examiner* — Mark Prenty
(74) *Attorney, Agent, or Firm* — Thompson Hine LLP; Francois Pagette

(57) ABSTRACT

Structures including a vertical field-effect transistor and fabrication methods for a structure including a vertical field-effect transistor. A vertical field-effect transistor includes a source/drain region located in a section of a semiconductor layer, a first semiconductor fin projecting from the source/drain region, a second semiconductor fin projecting from the source/drain region, and a gate electrode on the section of the semiconductor layer and coupled with the first semiconductor fin and with the second semiconductor fin. The structure further includes a contact located in a trench defined in the section of the semiconductor layer between the first semiconductor fin and the second semiconductor fin. The contact is coupled with the source/drain region of the vertical field-effect transistor.

10 Claims, 9 Drawing Sheets

US 9,831,317 B1

BURIED CONTACT STRUCTURES FOR A VERTICAL FIELD-EFFECT TRANSISTOR

BACKGROUND

The present invention relates to semiconductor device fabrication and integrated circuits and, more specifically, to structures including a vertical field-effect transistor, as well as methods of fabricating a structure including a vertical field-effect transistor.

Traditional complementary metal-oxide-semiconductor (CMOS) structures for a field-effect transistor include a source, a drain, a channel situated between the source and drain, and a gate electrode configured to respond to a gate voltage by selectively connecting the source and drain to each other through the channel. Field-effect transistor structures can be broadly categorized based upon the orientation of the channel relative to a surface of a semiconductor substrate in conjunction with which they are formed. In a vertical field-effect transistor, the channel is located in a semiconductor fin that projects vertically from the surface of the semiconductor substrate and that is surrounded by a gate electrode. A source/drain region is arranged at the bottom of the semiconductor fin, and another source/drain region is arranged at the top of the semiconductor fin. The gate electrode is arranged vertically between the source/drain regions. The direction of the gated current flow in the channel between the source/drain regions is generally perpendicular (i.e., vertical) to the substrate surface and parallel to the height of the fin.

To be contacted from above with a middle-of-line contact, the bottom source/drain region protrudes laterally relative to the footprint of the gate electrode to provide an area for landing the middle-of-line contact that is vertically oriented. As a consequence of the enhanced area of the bottom source/drain region, the contact and series resistance of the bottom source/drain region may be higher than desirable. In addition, the requirement for a middle-of-line contact hinders the scaling of inverters formed using vertical field-effect transistors.

Improved structures including a vertical field-effect transistor and improved fabrication methods for a structure including a vertical field-effect transistor are needed.

SUMMARY

According to an embodiment, a structure includes a vertical field-effect transistor having a source/drain region located in a section of a semiconductor layer, a first semiconductor fin projecting from the source/drain region, a second semiconductor fin projecting from the source/drain region, and a gate electrode on the section of the semiconductor layer and coupled with the first semiconductor fin and with the second semiconductor fin. The structure further includes a contact located in a trench defined in the section of the semiconductor layer between the first semiconductor fin and the second semiconductor fin. The contact is coupled with the source/drain region of the vertical field-effect transistor.

According to an embodiment, a method includes forming a first semiconductor fin and a second semiconductor fin of a field-effect transistor on a section of a semiconductor layer with the first semiconductor fin and second semiconductor fin having a parallel arrangement. The method further includes forming a trench in the section of the semiconductor layer that is positioned between the first semiconductor fin and the second semiconductor fin. The method further includes forming a contact in the trench in the section of the semiconductor layer. A source/drain region of the field-effect transistor is located in the section of the semiconductor layer. The trench is arranged in the section of the semiconductor layer such that the contact is coupled with the source/drain region of the field-effect transistor.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
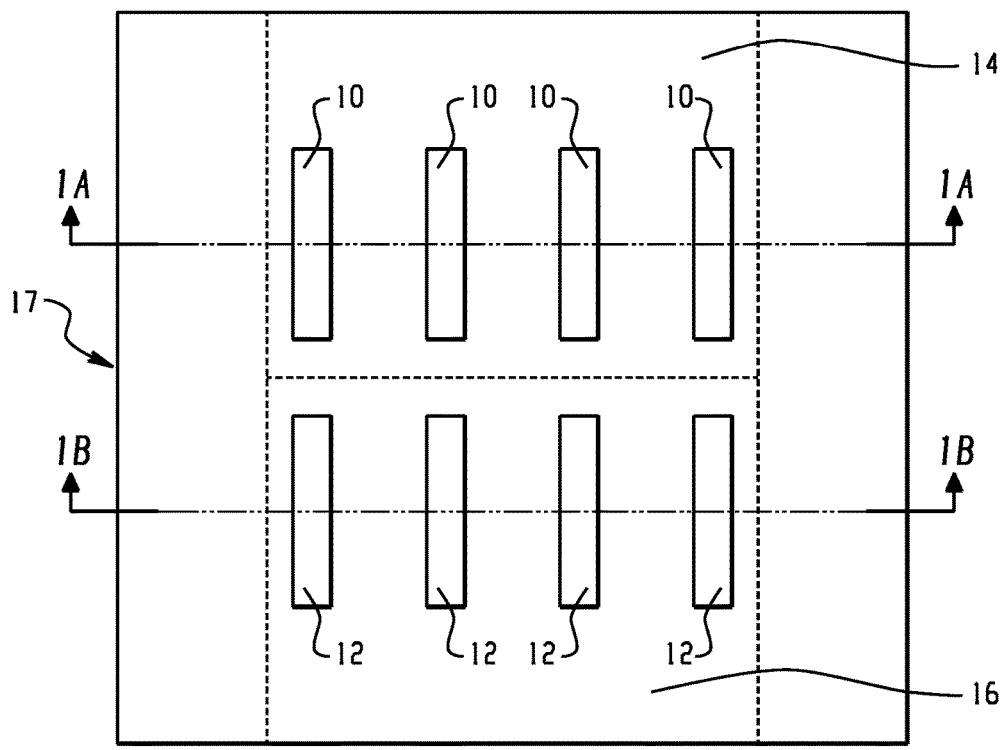
FIG. 1 is a top view of a structure at an initial fabrication stage of a processing method in accordance with embodiments of the invention and in which sections of a hardmask layer on top of the fins is omitted for clarity of description.
Figure 1A:
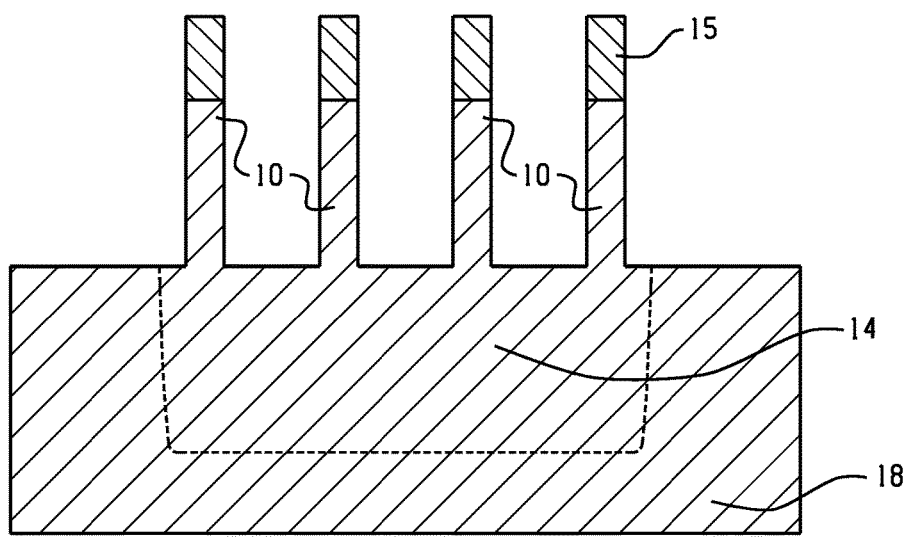
FIG. 1A is a cross-sectional view taken generally along line 1A-1A in FIG. 1.
Figure 1B:
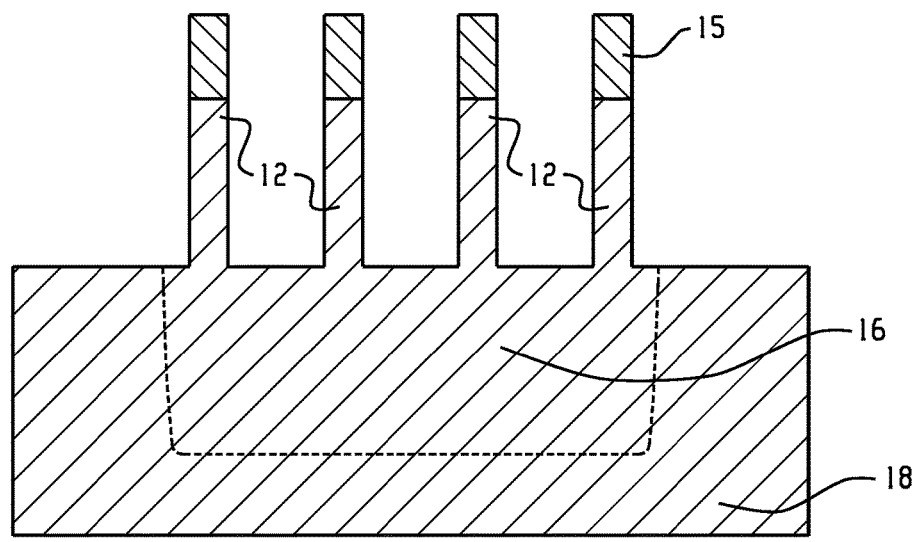
FIG. 1B is a cross-sectional view taken generally along line 1B-1B in FIG. 1.

With reference to FIGS. 1, 1A, 1B and in accordance with an embodiment of the invention, fins 10 may project vertically from a doped layer 14, and fins 12 may project vertically from a doped layer 16. Each of the fins 12 may be aligned in a row with one of the fins 10, and each of the fins 10 and the fins 12 may be capped by a section of the hardmask layer 15. The doped layers 14, 16 may constitute portions of an epitaxial semiconductor layer 17 at the top surface of a substrate 18. The substrate 18 beneath the doped layer 14 may be, for example, a bulk single-crystal silicon substrate.

The fins 10, 12 may be three-dimensional bodies comprised of a semiconductor material, such as intrinsic silicon, and may project in a vertical direction relative to a top surface of the substrate 18. The fins 10, 12 may be formed from an epitaxial layer of intrinsic semiconductor material that is grown on a top surface of the doped layer 14 and patterned using photolithography and etching processes, such as a sidewall imaging transfer (SIT) process or self-aligned double patterning (SADP). Each of the fins 10, 12 may be capped by a section of a hardmask layer 15 composed of, for example, silicon nitride ($Si_3N_4$), that is introduced during fin patterning.

The fins 10 may be used to form a vertical field-effect transistor in which the doped layer 14 serves as a bottom source/drain electrode. The fins 12 may be used to form a vertical field-effect transistor in which the doped layer 16 serves as a bottom source/drain electrode. As used herein, the term "source/drain region" means a doped region of semiconductor material that can function as either a source or a drain of a vertical field-effect transistor.

In an embodiment, the fins 10 may be used to form an n-type vertical field-effect transistor, and the fins 12 may be used to form a p-type vertical field-effect transistor. For an n-type vertical field-effect transistor formed using fins 10, the doped layer 14 may be composed of silicon and include a concentration of an n-type dopant from Group V of the Periodic Table (e.g., phosphorus (P) or arsenic (As)) that is effective to impart n-type electrical conductivity to the constituent semiconductor material. For a p-type vertical field-effect transistor formed using fins 12, the doped layer 16 may be composed of a silicon-germanium (SiGe) alloy and include a concentration of p-type dopant from Group III of the Periodic Table (e.g., boron (B)) in a concentration that is effective to impart p-type to the constituent semiconductor material. If composed of a silicon-germanium (SiGe) alloy, the doped layer 16 may be formed by, for example, a thermal condensation technique.

Figure 2:
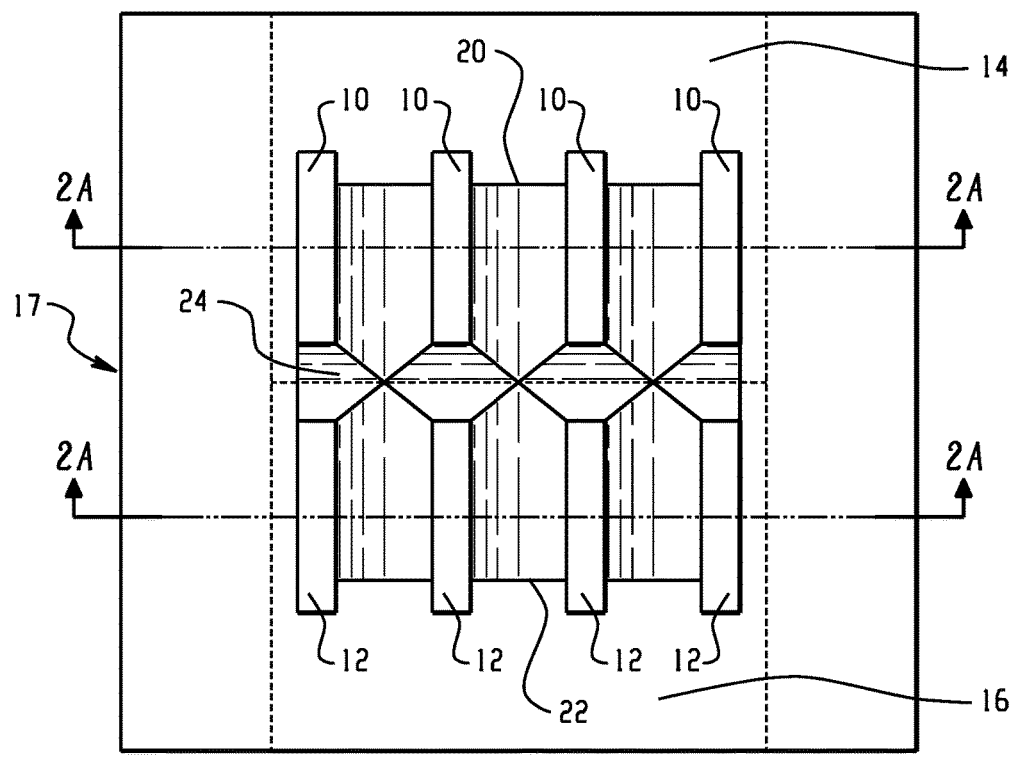
FIG. 2 is a top view of the structure at a fabrication stage of the processing method subsequent to FIG. 1 and in which sections of a hardmask layer on top of the fins is omitted for clarity of description.
Figure 2A:
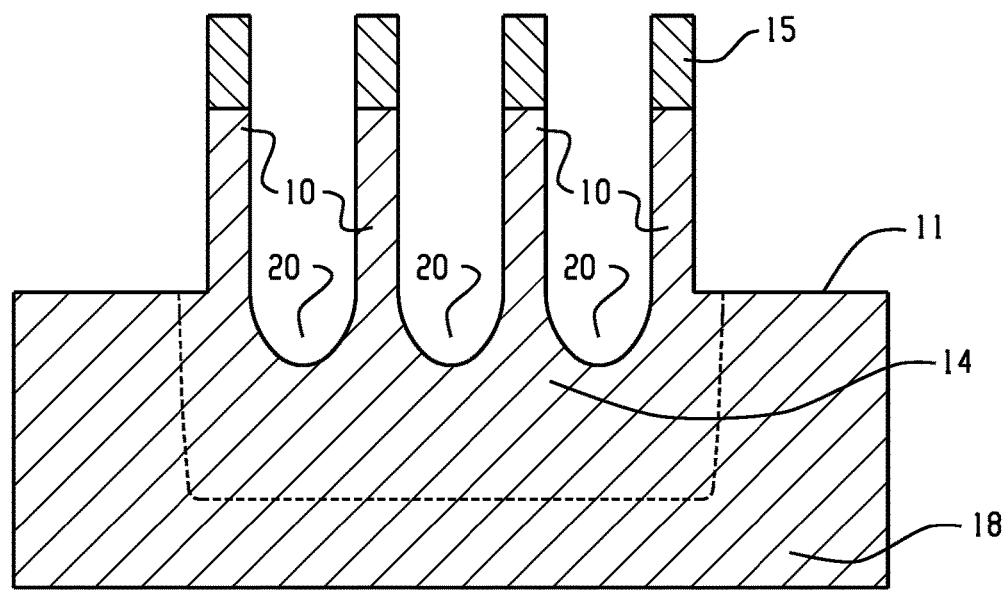
FIG. 2A is a cross-sectional view taken generally along line 2A-2A in FIG. 2.
Figure 2B:
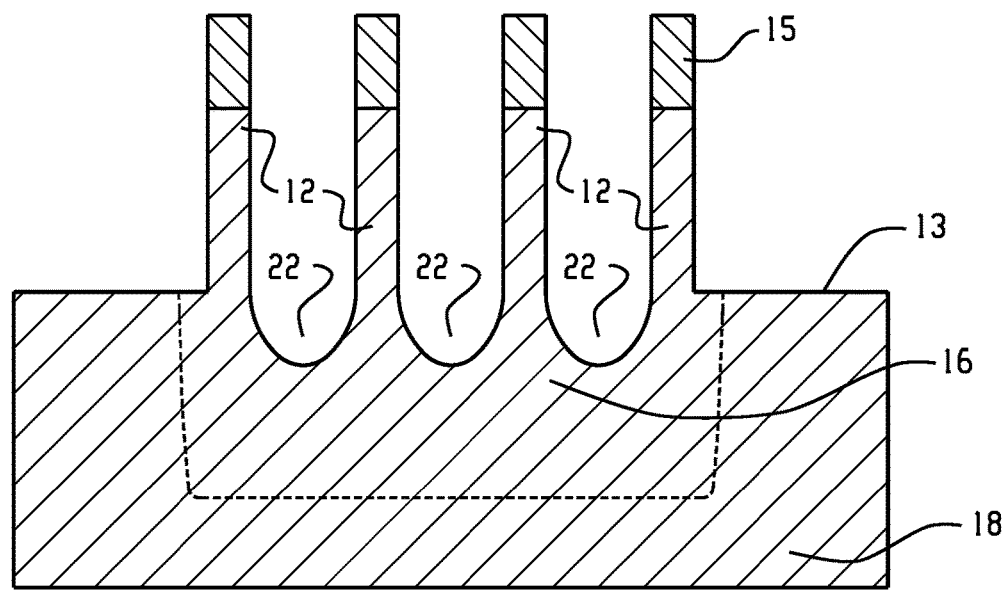
FIG. 2B is a cross-sectional view taken generally along line 2B-2B in FIG. 2.

With reference to FIGS. 2, 2A, 2B in which like reference numerals refer to like features in FIGS. 1A, 1B and at a subsequent fabrication stage, trenches 20 are formed in the doped layer 14, trenches 22 are formed in the doped layer 16, and a trench 24 is formed at a location positioned between the trenches 20 and the trenches 22. Each of the trenches 20 is located between a pair of the fins 10 and may extend along a portion of the length of the fins 10. The trenches 20 are recessed into the doped layer 14 to a given depth relative to a top surface 11 of the doped layer 14 and a top surface 13 of the doped layer 16. Each of the trenches 22 is located between a pair of the fins 12 and may extend along a portion of the length of the fins 12. The trenches 22 are recessed into the doped layer 16 to a given depth relative to a top surface 13 of the doped layer 16. The fins 10 and trenches 20 are located on one side of trench 24, and fins 12 and trenches 22 are located on the opposite side of trench 24. As a result, the trench 24 is located between fins 10 and fins 12. Trenches 20 and trenches 22 intersect with the trench 24 to form a continuous recessed volume. The trench 24 is recessed into both of the doped layers 14, 16 to a given depth relative to the top surfaces 11, 13. In an embodiment, the depths of the trenches 20, 22, 24 may be equal.

The trenches 20, 22, 24 maybe formed by a self-aligned etching process. The top surfaces 11, 13 may be slightly recessed by the self-aligned etching process by a lesser extent than at the location of the trenches 20 between the adjacent fins 10, trenches 22 between adjacent fins 12, and trench 24 between the fins 10 and the fins 12. The self-aligned etching process may rely on loading or another effect that causes deeper etching over smaller-size areas located between adjacent pairs of the fins 10, 12. In an embodiment, the self-aligned etching process may be performed in conjunction with the etching process forming the fins 10, 12 in a seamless manner, rather than performed as a separate etching process as in the representative embodiment.

In an alternative embodiment, an additional trench 20 may be formed in the doped layer 14 adjacent to each of the fins 10 that are at the opposite edges of the set of fins 10, and an additional trench 22 may be formed in the doped layer 16 adjacent to each of the fins 12 that are at the opposite edges of the set of fins 12. The added trenches 20, 22 are intersected by extensions of trench 24. The added trenches 20, which are located adjacent to only a single fin 10, may be narrower in width than the trenches 20 that are located between adjacent pairs of fins 10. The added trenches 22, which are located adjacent to only a single fin 12, may be narrower in width than the trenches 22 that are located between adjacent pairs of fins 12.

With reference to FIGS. 3, 3A, 3B, 3C in which like reference numerals refer to like features in FIGS. 2, 2A, 2B and at a subsequent fabrication stage, spacers 26 are formed along the sidewalls of the fins 10, 12. The spacers 26 may be composed of a dielectric material, such as silicon nitride ($Si_3N_4$) deposited by CVD. To that end, a conformal layer of the dielectric material may be deposited and etched with an anisotropic etching process, such as reactive ion etching (RIE), that preferentially removes the dielectric material of conformal layer from horizontal surfaces and leaves the spacers 26 on vertical surfaces (e.g., the vertical sidewalls of the fins 10, 12).

The trenches 20, 22, 24 are respectively filled with contacts 28, 30, 32. To that end, a conductor layer may be deposited and recessed with an etching process such that the remaining conductor is located in the trenches 20, 22, 24 to form the contacts 28, 30, 32. The contacts 28, 30, 32 may be composed of a metal, such as titanium (Ti), titanium nitride (TiN), tungsten (W), deposited by CVD. The contacts 28 are coupled with the bottom source/drain provided by the doped layer 14 associated with fins 10. The contacts 30 are coupled with the bottom source/drain provided by the doped layer 16 associated with fins 12. The contact 32 cross-couples the contacts 28 with the contacts 30. The spacers 26 are located between the conductor layer and the fins 10, 12 so as to prevent contact, and protect the fins 10, 12 during the etching process that recesses the conductor layer.

Figure 3:
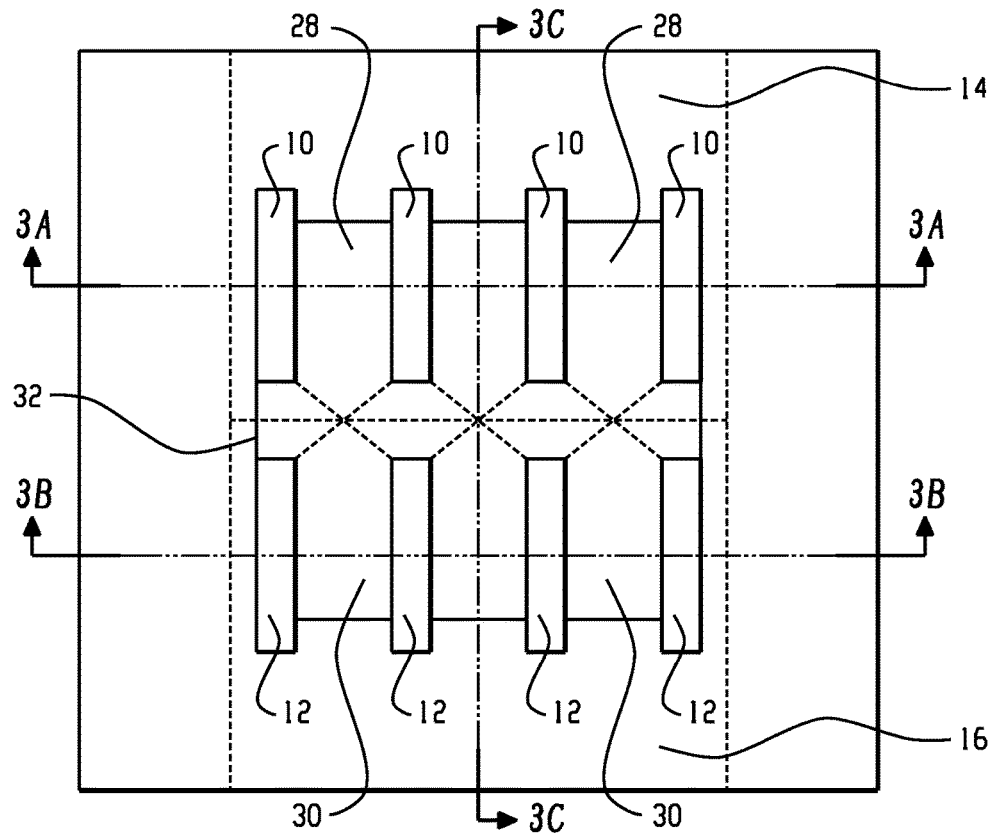
FIG. 3 is a top view of the structure at a fabrication stage of the processing method subsequent to FIG. 2 and in which sections of a hardmask layer on top of the fins and sidewall spacers are omitted for clarity of description.
Figure 3A:
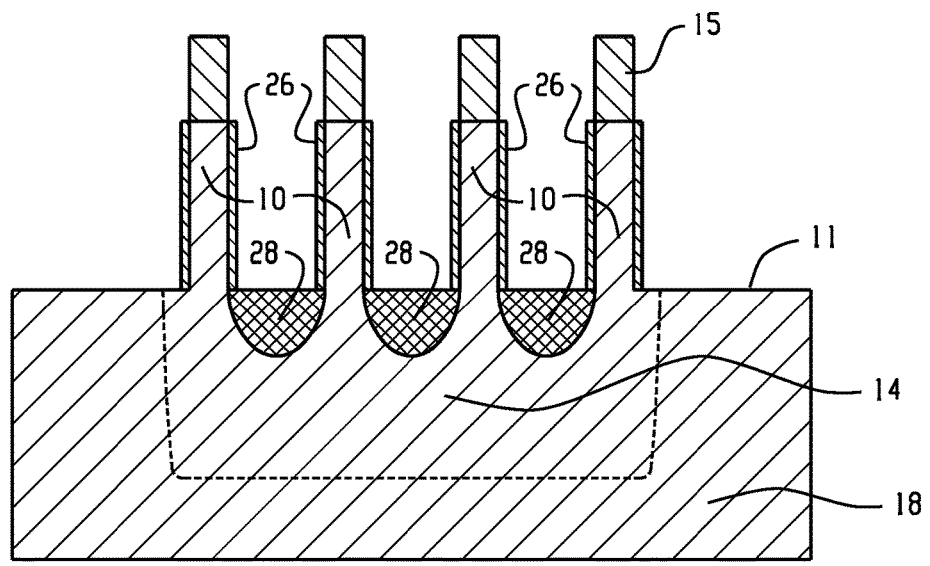
FIG. 3A is a cross-sectional view taken generally along line 3A-3A in FIG. 3.
Figure 3B:
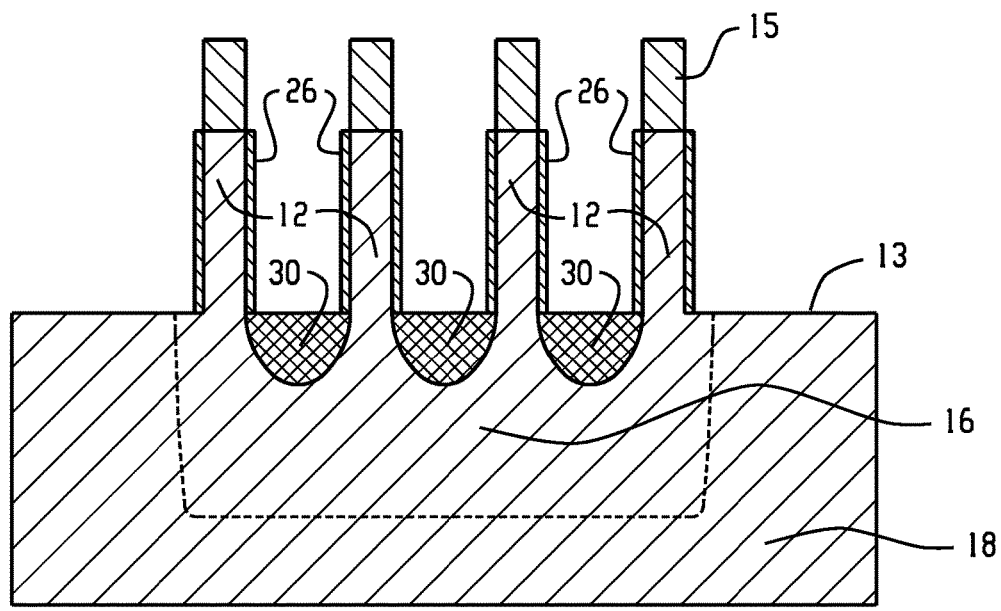
FIG. 3B is a cross-sectional view taken generally along line 3B-3B in FIG. 3.
Figure 3C:
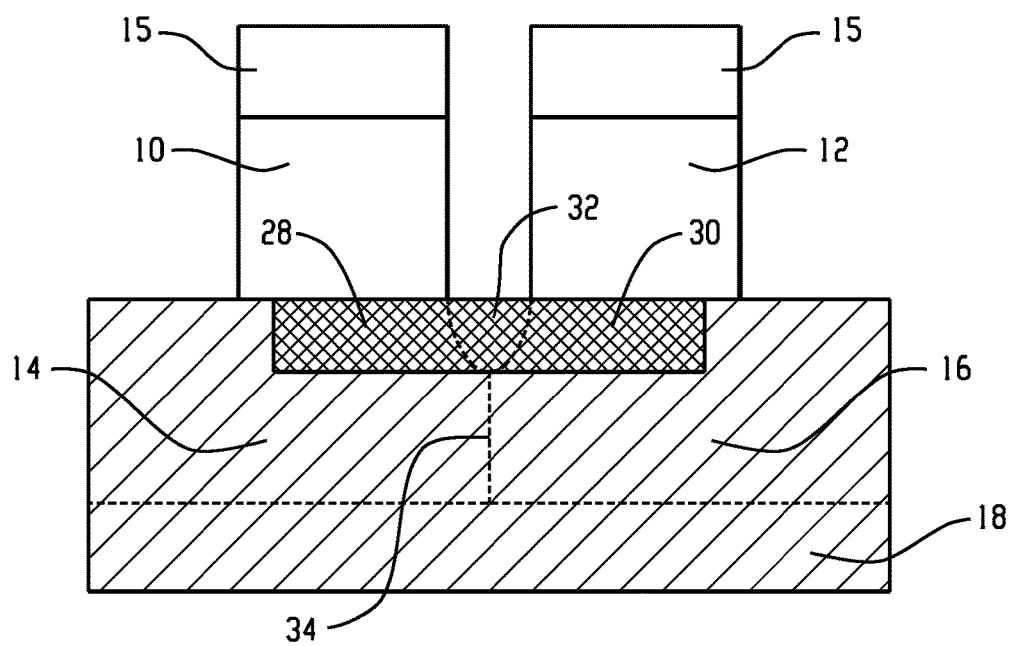
FIG. 3C is a cross-sectional view taken generally along line 3C-3C in FIG. 3.

As best shown in FIG. 3C, the doped layer 14 intersects with the doped layer 16 along a vertical interface 34 to define a p-n junction. The p-n junction defined by the vertical interface 34 is located vertically beneath the contact 32. The contacts 28, 30, 32 provide a continuous conductive path that is in a contacting relationship with the doped layer 14 and in a contacting relationship with the doped layer 16.

Figure 4:
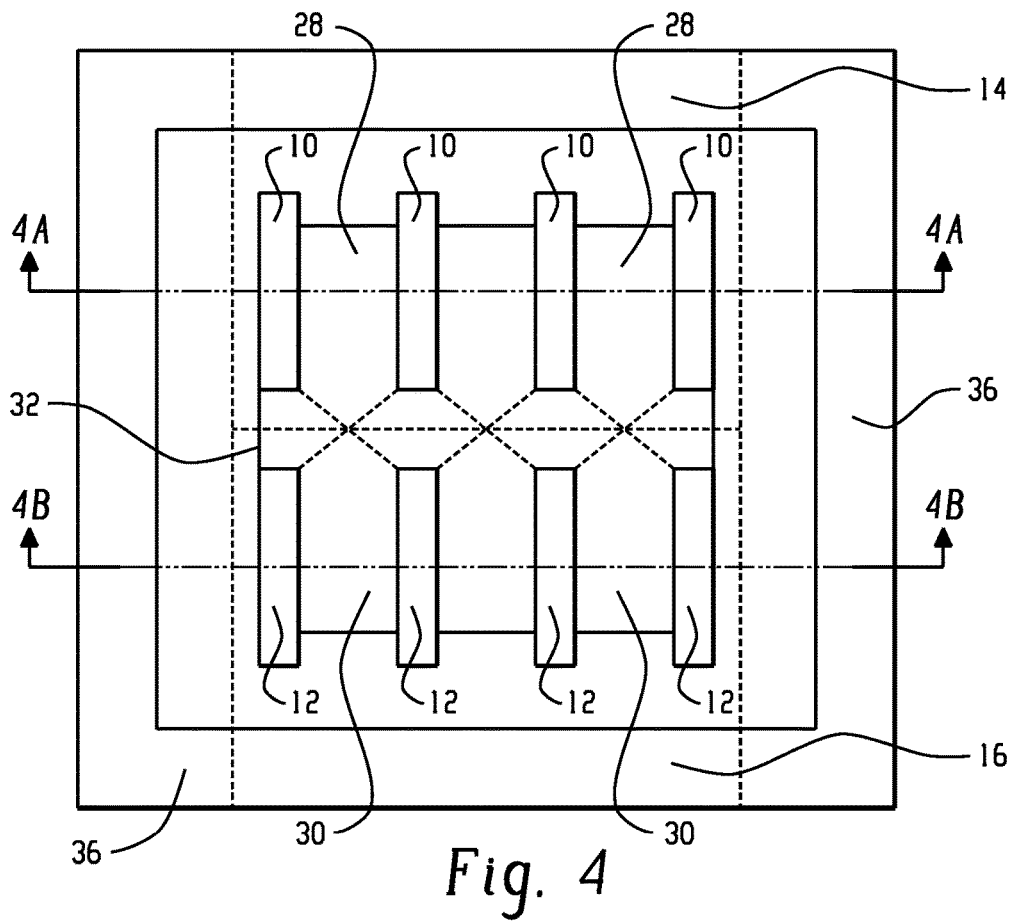
FIG. 4 is a top view of the structure at a fabrication stage of the processing method subsequent to FIG. 3 and in which sections of a hardmask layer on top of the fins is omitted for clarity of description.
Figure 4A:
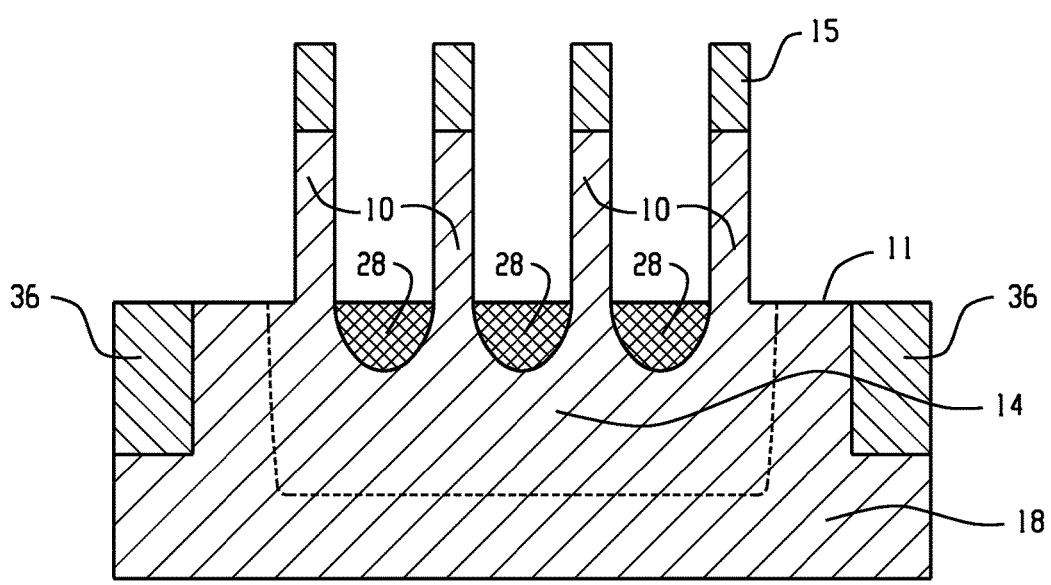
FIG. 4A is a cross-sectional view taken generally along line 4A-4A in FIG. 4.
Figure 4B:
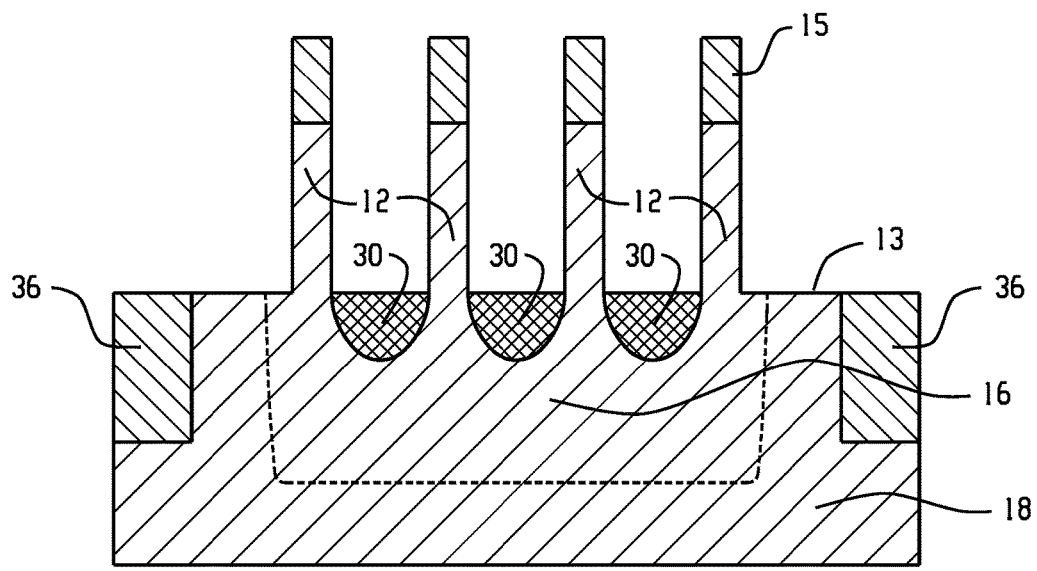
FIG. 4B is a cross-sectional view taken generally along line 4B-4B in FIG. 4.

With reference to FIGS. 4, 4A, 4B in which like reference numerals refer to like features in FIGS. 3, 3A, 3B, 4C and at a subsequent fabrication stage, a trench isolation region 36 is formed in the doped layers 14, 16. The trench isolation region 36 defines the size, geometrical shape, and outer boundary for the active device regions used to form the vertical field-effect transistors and extends about the outer perimeter of these active device regions. The trench isolation region 36 is located in trenches penetrating vertically to a shallow depth into the doped layers 14, 16. The trench isolation region 36 may be formed by a shallow trench isolation (STI) technique that relies on lithography and dry etching processes to define the trenches, deposits an electrical insulator to fill the trenches, and recesses the electrical insulator using, for example, an etch-back process. The trench isolation region 36 may be comprised of a dielectric material, such as silicon dioxide (e.g., $SiO_2$), deposited by CVD.

The trench isolation region 36 does not extend into the space between the fins 10 and the fins 12 because this space is occupied by the contact 32, as best shown in FIG. 3C. As such, the normal trench isolation that is formed between the fins 10 and the fins 12 can be eliminated. The doped layer 14 providing a bottom source/drain region for vertical field-effect transistors of one CMOS type and the doped layer 16 providing a bottom source/drain region for vertical field-effect transistors of the opposite CMOS type are touching and in contact, which provides an n-p junction. The sharing of the bottom source/drain regions afforded by the elimination of the conventional trench isolation region between fins 10 and fins 12 may permit a significant reduction in the footprint of a CMOS inverter by shrinking the dimensions of the device layout.

Figure 5A:
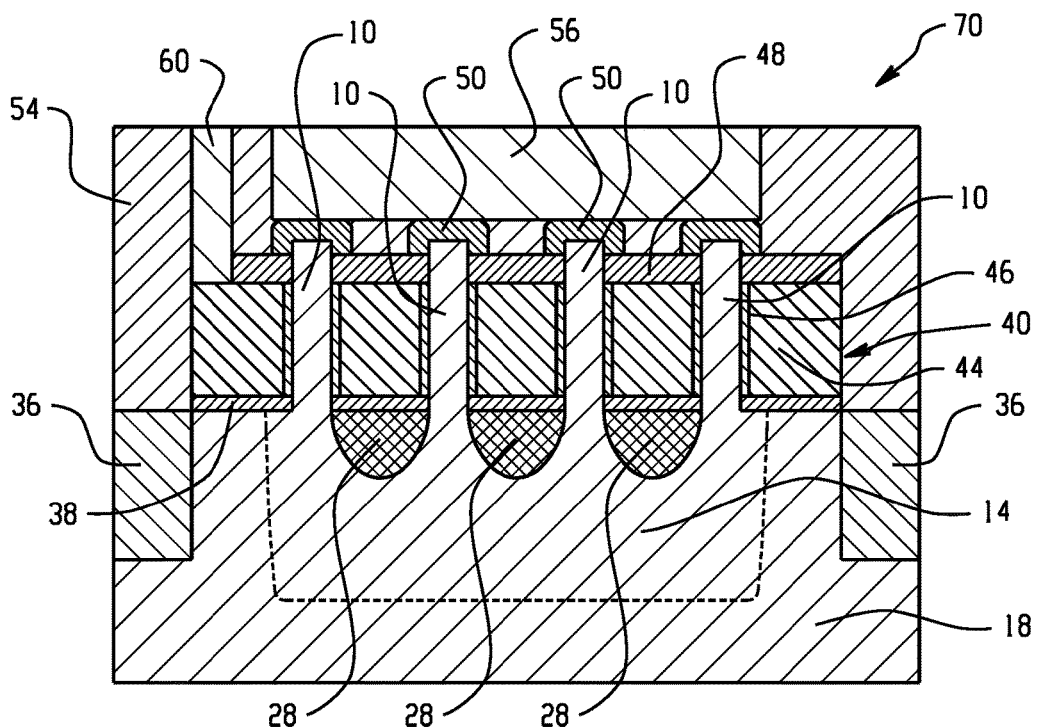
FIGS. 5A and 5B are respective cross-sectional views at a fabrication stage of the processing method subsequent to FIGS. 4A and 4B.
Figure 5B:
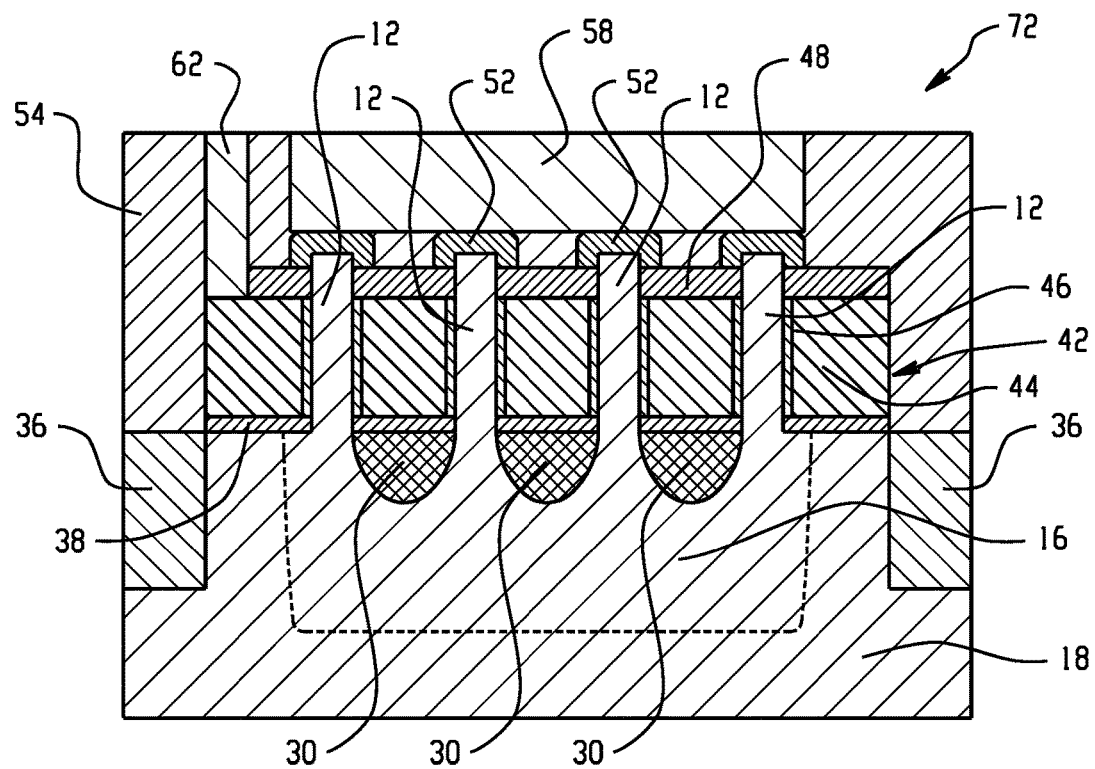

With reference to FIGS. 5A, 5B in which like reference numerals refer to like features in FIGS. 4A, 4B and at a subsequent fabrication stage, a bottom spacer layer 38 is formed on the top surface 13 of the doped layer 14, on the top surface of the doped layer 16, and on the contacts 28, 30, 32. The bottom spacer layer 38 may be composed of a dielectric material, such as silicon nitride ($Si_3N_4$), that is deposited by a directional deposition technique, such as gas cluster ion beam (GCM) deposition. The fins 10, 12 penetrate vertically through the thickness of the bottom spacer layer 38 with only a fraction of their respective lengths overlapped by the bottom spacer layer 38, while the contacts are buried in the doped layers 14, 16 beneath the bottom spacer layer 38.

A gate electrode 40 is formed that surrounds respective vertical channel regions of the fins 10 and a gate electrode 42 is formed that surrounds respective vertical channel regions of the fins 12. The gate electrodes 40, 42 each include a gate electrode layer 44 and a gate dielectric layer 46. The gate electrode layer 44 may be composed of one or more metals (e.g., titanium (Ti) and/or tungsten (W)) deposited by physical vapor deposition (PVD), CVD, etc. The gate dielectric layer 46 may be composed of an electrical insulator, such as a high-k dielectric material like hafnium oxide, deposited by CVD, ALD, etc. The gate electrodes 40, 42 may be formed by conformally depositing the gate dielectric layer 46, depositing the gate electrode layer 44, and recessing these layers 44, 46 with an etching process.

A top spacer layer 48 is formed on the top surface of the gate electrode layer 44. The top spacer layer 48 may be composed of a dielectric material, such as silicon nitride (Si3N4), that is deposited by CVD and then planarized by chemical mechanical polishing (CMP). The fins 10, 12 may penetrate vertically through the thickness of the top spacer layer 48 and protrude above the top spacer layer 48. The recessed top surface of the gate electrode layer 44 provides the vertical space needed to form the top spacer layer 48.

The layer stack that includes the bottom spacer layer 38, gate electrode layer 44, and top spacer layer 48 may be patterned by performing a masked etch, such as reactive ion etching (RIE) with an etch mask applied, using one or more etch chemistries. The gate electrode layer 44 is patterned to form the gate electrodes 40, 42. A patterned section of the bottom spacer layer 38 underlies each of the gate electrodes 40, 42 and a patterned section of the top spacer layer 48 overlies each of the gate electrodes 40, 42. Following the patterning, the gate electrodes 40 and 42 may be connected with each other, as in an inverter. Alternatively, the gate electrode 40 may be disconnected and isolated from gate electrode 42 after patterning.

Top source/drain regions 50 of a vertical field-effect transistor 70 are formed that are respectively coupled with one end of the fins 10. A vertical channel region is defined in a portion of the fins 10 overlapped by the gate electrode 40 vertically between the bottom source/drain region defined by the doped layer 14 and the top source/drain regions 50. The semiconductor material constituting the top source/drain regions 50 is doped to have the same conductivity type as the doped layer 14. For example, if the doped layer 14 is n-type, then the top source/drain regions 50 may be sections of an epitaxial layer of semiconductor material formed by an epitaxial growth process with in-situ doping, and may include a concentration of an n-type dopant from Group V of the Periodic Table (e.g., phosphorus (P) or arsenic (As)) effective to impart n-type electrical conductivity to the constituent semiconductor material.

In an embodiment, the top source/drain regions 50 may be formed by a selective epitaxial growth (SEG) process in which semiconductor material nucleates for epitaxial growth on semiconductor surfaces such as the surfaces of the fins 10, but does not nucleate for epitaxial growth from insulator surfaces (e.g., the top spacer layer 48). The top source/drain regions 50 may grow upwardly and laterally to overgrow areas on the top surface of the top spacer layer 48 locally near the respective fins 10. The top source/drain regions 50 are positioned in alignment with the portions of the fins 10 revealed through the top spacer layer 48.

Similarly, top source/drain regions 52 of a vertical field-effect transistor 72 are formed that are respectively coupled with one end of the fins 12. A vertical channel region is defined in a portion of the fins 12 overlapped by the gate electrode 42 vertically between the bottom source/drain region defined by the doped layer 16 and the top source/drain regions 52. The semiconductor material constituting the top source/drain regions 52 is doped to have the same conductivity type as the doped layer 16. For example, if the doped layer 16 is p-type, then the top source/drain regions 52 may be sections of an epitaxial layer of semiconductor material formed by an epitaxial growth process with in-situ doping, and may include a concentration of a p-type dopant from Group III of the Periodic Table (e.g., boron (B)) effective to impart p-type electrical conductivity to the constituent semiconductor material. The top source/drain regions 52 may be composed of a silicon-germanium (SiGe) alloy and may be formed separately from the top source/drain regions 50. The epitaxial growth process forming the top source/drain regions 52 is separate and distinct from the epitaxial growth process forming the top source/drain regions 50. The top source/drain regions 50 may be masked with a protective layer during the growth of the top source/drain regions 52.

In an embodiment, the top source/drain regions 52 may be formed by a selective epitaxial growth (SEG) process in which semiconductor material nucleates for epitaxial growth on semiconductor surfaces such as the surfaces of the fins 12, but does not nucleate for epitaxial growth from insulator surfaces (e.g., the top spacer layer 48). The top source/drain regions 52 may grow upwardly and laterally to overgrow areas on the top surface of the top spacer layer 48 locally near the respective fins 12. The top source/drain regions 52 are positioned in alignment with the portions of the fins 12 revealed through the top spacer layer 48.

Middle-of-line (MOL) processing follows to define a local interconnect structure. An interlayer dielectric layer 54 is formed that covers the vertical field-effect transistors 70, 72. The interlayer dielectric layer 54 may be composed of a dielectric material, such as silicon dioxide ($SiO_2$), deposited by chemical vapor deposition (CVD) and planarized with, for example, CMP. A contact 56 is formed in the interlayer dielectric layer 54 that is coupled with the top source/drain regions 50 of the vertical field-effect transistor 70. A contact 58 is formed in the interlayer dielectric layer 54 that is coupled with the top source/drain regions 52 of the vertical field-effect transistor 72. A contact 60 is formed in the interlayer dielectric layer 54 that is coupled with the gate electrode 40 of the vertical field-effect transistor 70. A contact 62 is formed in the interlayer dielectric layer 54 that is coupled with the gate electrode 40 of the vertical field-effect transistor 72. A contact 64 is formed in the interlayer dielectric layer 54 that is coupled with the doped layer 16 of the vertical field-effect transistor 72. The contacts 56, 58, 60, 62, 64 may be composed of a conductor, such as tungsten (W), and may be clad with a conductive liner (e.g., titanium nitride (TiN)).

Back-end-of-line (BEOL) processing follows, which includes formation of dielectric layers, via plugs, and wiring for an interconnect structure coupled by the local interconnect structure with the vertical field-effect transistors 70, 72, as well as other similar contacts for additional device structures that replicate the vertical field-effect transistors 70, 72.

Figure 5C:
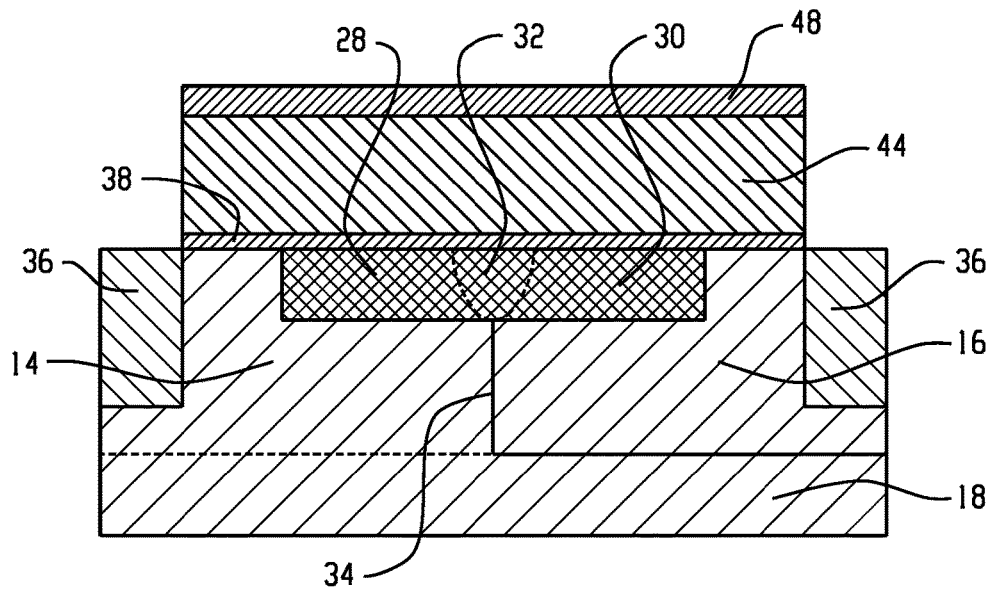
FIG. 5C is a cross-sectional view similar to FIG. 3C at the fabrication stage of FIGS. 5A and 5B.

With reference to FIG. 5C, the doped layers 14, 16 representing the respective source/drain regions of the vertical field-effect transistors 70, 72 are coupled together by the buried metal of the contacts 28, 30, 32. The doped layer 14 has an ohmic contact with the contact 28, and the doped layer 16 has an ohmic contact with the contact 30.

The contacts 28, 30, 32 provide an electrical connection that eliminates the need for contacts and trench silicide that extend through the interlayer dielectric layer 54 to, for example, the doped layer 14 serving as the bottom source/drain region of the vertical field-effect transistor 70. For this reason, the buried metal structure represented by the contacts 28, 30, 32 may promote interconnection of the bottom source/drain regions of the vertical field-effect transistors 70, 72 in an inverter with less wiring in the BEOL interconnect structure.

The buried metal structure, which is provided by the contacts 28, 30, 32, may significantly reduce contact and series resistance so as to improve the performance of advanced devices. The elimination of trench isolation between the fins 10 and the fins 12 may promote the scaling of a MOSFET inverter formed using the vertical field-effect transistors 70, 72 because a minimum space for the insertion of trench isolation is not needed in the device layout so as to shrink the size of a standard cell.

Figure 6:
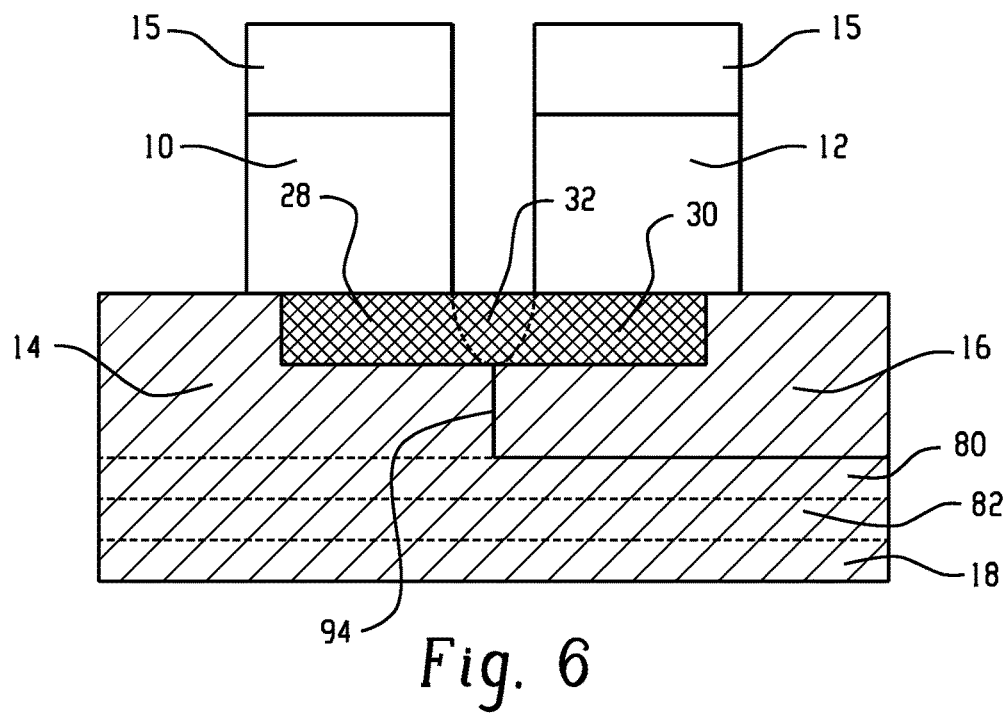
FIG. 6 is a cross-sectional view similar to FIG. 3C in accordance with alternative embodiments of the invention.

With reference to FIG. 6 in which like reference numerals refer to like features in FIG. 3C and in accordance with an alternative embodiment, the doped layers 14, 16 may be located over a lightly-doped layer 80 formed in the substrate 18. The lightly-doped layer 80 is separated vertically from a portion of the substrate 18 by a doped layer 82. The semiconductor material of the substrate 18 may be doped to have a particular conductivity type. The doped layer 82 may be constituted by semiconductor material of the substrate 18 that has been doped to have the opposite conductivity type from the lightly-doped layer 80 and the substrate 18.

In an embodiment, the doped layer 82 may be composed of n-type semiconductor material from an n-well, the lightly-doped layer 80 may be composed of p-type semiconductor material formed by ion implantation, and the substrate 18 may be composed of p-type semiconductor material. In an embodiment, the doped layer 82 may be composed of n-type semiconductor material from a deep n-well, the lightly-doped layer 80 may be composed of n-type semiconductor material from a p-well, and the substrate 18 may be composed of p-type semiconductor material.

Figure 7:
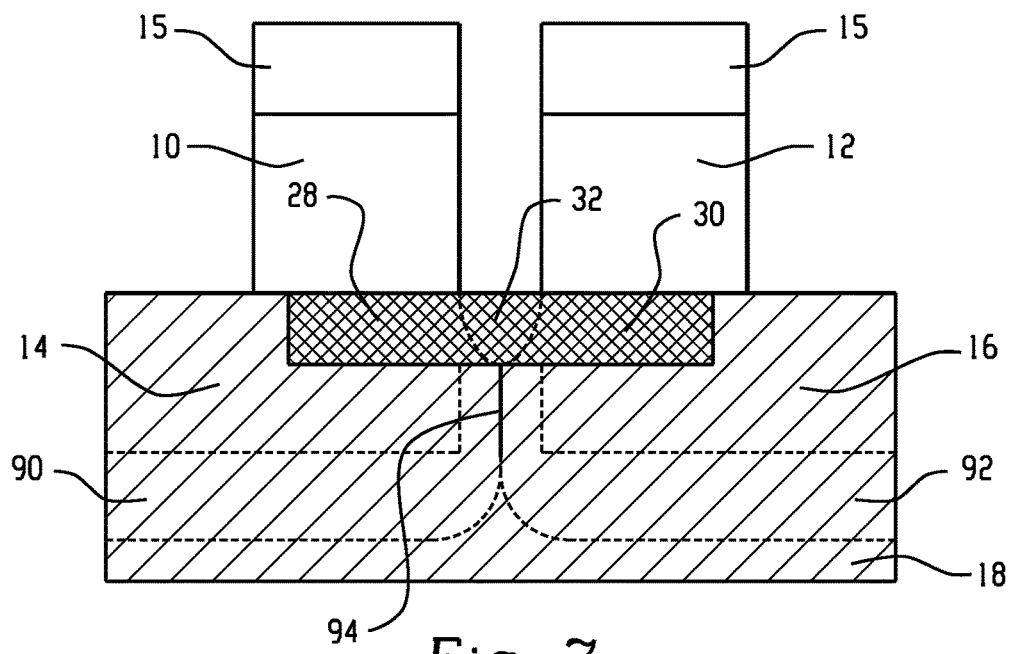
FIG. 7 is a cross-sectional view similar to FIG. 3C in accordance with alternative embodiments of the invention.

With reference to FIG. 7 in which like reference numerals refer to like features in FIG. 3C and in accordance with an alternative embodiment, the doped layer 14 may be formed in a well 90 constituted by semiconductor material of the substrate 18 that has been doped to have the opposite conductivity type from the doped layer 14. Similarly, the doped layer 16 may be formed in a well 92 constituted by semiconductor material of the substrate 18 that has been doped to have the opposite conductivity type from the doped layer 16. The well 90 and the well 92 intersect along a vertical interface 94 to define a p-n junction, which is located vertically beneath the contact 32. The doped layers 14, 16 are separated from each and do not intersect because the vertical interface 94 and portions of the wells 90, 92 are located in a space between the doped layer 14 and the doped layer 16. The contacts 28, 30, 32 provide a continuous conductive path that is in a contacting relationship with the doped layer 14 and that is also in a contacting relationship with the doped layer 16.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The terms "horizontal" and "lateral" as used herein are defined as a plane parallel to a conventional plane of a semiconductor substrate, regardless of its actual three-dimensional spatial orientation. The terms "vertical" and "normal" as used herein refer to a direction perpendicular to the horizontal, as just defined. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first vertical field-effect transistor having a source/drain region located in a first section of a semiconductor layer, a first semiconductor fin projecting from the source/drain region, a second semiconductor fin projecting from the source/drain region, and a gate electrode on the first section of the semiconductor layer and coupled with the first semiconductor fin and with the second semiconductor fin of the first vertical field-effect transistor; and
   a first contact located in a first trench defined in the first section of the semiconductor layer between the first semiconductor fin and the second semiconductor fin of the first vertical field-effect transistor, the first contact coupled with the source/drain region of the first vertical field-effect transistor.

2. The structure of claim 1 further comprising:
   a second vertical field-effect transistor having a source/drain region located in a second section of the semiconductor layer, a first semiconductor fin projecting from the source/drain region, a second semiconductor fin projecting from the source/drain region, and a gate electrode on the second section of the semiconductor layer and coupled with the first semiconductor fin and the second semiconductor fin of the second vertical field-effect transistor; and
   a second contact located in a second trench defined in the second section of the semiconductor layer between the first semiconductor fin and the second semiconductor fin of the second vertical field-effect transistor, the second contact coupled with the source/drain region of the second vertical field-effect transistor.

3. The structure of claim 2 wherein the first contact is coupled with the second contact such that the source/drain region of the first vertical field-effect transistor is coupled with the source/drain region of the second vertical field-effect transistor.

4. The structure of claim 3 further comprising:
   a third contact in a third trench partially located in the first section of the semiconductor layer and partially located in the second section of the semiconductor layer, the third contact directly coupling the first contact with the second contact.

5. The structure of claim 4 wherein the third contact is located between the first semiconductor fin and the second semiconductor fin of the first vertical field-effect transistor and the first semiconductor fin and the second semiconductor fin of the second vertical field-effect transistor.

6. The structure of claim 5 wherein the first contact is aligned parallel to the first semiconductor fin and the second semiconductor fin of the first vertical field-effect transistor, the second contact is aligned parallel to the first semiconductor fin and the second semiconductor fin of the second vertical field-effect transistor, and the third contact is aligned perpendicular to the first contact and the second contact.

7. The structure of claim 3 further comprising:
   a first middle-of-line contact extending vertically to contact either the source/drain region of the first vertical field-effect transistor or the source/drain region of the second vertical field-effect transistor,
   wherein the other of the source/drain region of the first vertical field-effect transistor or the source/drain region of the second vertical field-effect transistor is not contacted by a second middle-of-line contact.

8. The structure of claim 2 wherein the first section of the semiconductor layer is located in a first well, the second section of the semiconductor layer is located in a second well of opposite conductivity type from the first well, and the first well intersects the second well along a vertical junction located between the first section of the semiconductor layer and the second section of the semiconductor layer.

9. The structure of claim 2 further comprising:
   a trench isolation region surrounding the first section of the semiconductor layer and the second section of the semiconductor layer,
   wherein the trench isolation region is absent between the first semiconductor fin and the second semiconductor fin of the first vertical field-effect transistor and between the first semiconductor fin and the second semiconductor fin of the second vertical field-effect transistor.

10. The structure of claim 2 wherein the first section of the semiconductor layer and the second section of the semiconductor layer are located vertically above a first doped layer, a second doped layer, and a substrate with the second doped layer vertically between the first doped layer and the substrate, and the second doped layer has an opposite conductivity type from the first doped layer and the substrate.

* * * * *